US008267157B2

(12) United States Patent
Qin et al.

(10) Patent No.: US 8,267,157 B2
(45) Date of Patent: Sep. 18, 2012

(54) HEAT DISSIPATION DEVICE

(75) Inventors: Ji-Yun Qin, Shenzhen (CN); Zhi-Yong Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 544 days.

(21) Appl. No.: 12/535,672

(22) Filed: Aug. 4, 2009

(65) Prior Publication Data
US 2010/0258273 A1  Oct. 14, 2010

(30) Foreign Application Priority Data

Apr. 11, 2009  (CN) .......................... 2009 1 0301493

(51) Int. Cl.
*F28F 7/00* (2006.01)
*F28D 15/00* (2006.01)
*H05K 7/20* (2006.01)
(52) U.S. Cl. ................... 165/80.2; 165/104.33; 361/700
(58) Field of Classification Search ............. 165/104.33; 361/700; 257/715
See application file for complete search history.

(56) References Cited

U.S. PATENT DOCUMENTS

| | | | |
|---|---|---|---|
| 6,915,844 B2 * | 7/2005 | Chou | 165/104.33 |
| 6,918,429 B2 * | 7/2005 | Lin et al. | 165/80.3 |
| 6,978,829 B1 * | 12/2005 | Lin | 165/104.33 |
| 7,025,125 B2 * | 4/2006 | Sheng et al. | 165/104.33 |
| 7,036,566 B1 * | 5/2006 | Huang | 165/104.33 |
| 7,100,681 B1 * | 9/2006 | Wu et al. | 165/104.33 |
| 7,143,819 B2 * | 12/2006 | Malone et al. | 165/104.33 |
| 7,661,466 B2 * | 2/2010 | Li et al. | 165/104.33 |
| 2005/0098304 A1 * | 5/2005 | Lin et al. | 165/104.33 |
| 2006/0259405 A1 * | 11/2006 | Friesen et al. | 705/37 |
| 2006/0278374 A1 * | 12/2006 | Hao et al. | 165/104.33 |
| 2007/0114009 A1 * | 5/2007 | Xia et al. | 165/104.33 |
| 2007/0217153 A1 * | 9/2007 | Lai et al. | 361/700 |
| 2008/0121371 A1 * | 5/2008 | Zhou et al. | 165/80.3 |
| 2008/0314556 A1 * | 12/2008 | Zhou et al. | 165/80.3 |

* cited by examiner

*Primary Examiner* — Allen J. Flanigan
*Assistant Examiner* — Jason Thompson
(74) *Attorney, Agent, or Firm* — Altis Law Group, Inc.

(57) ABSTRACT

A heat dissipation device includes a base and a fin group placed on the base and a plurality of heat pipes thermally connecting the base and the fin group together. The base includes a substrate and a conducting plate attached to a bottom of the substrate. The heat pipes include evaporating sections and condensing sections extending upwardly from the evaporating sections and through the fin group. The evaporating sections are wholly accommodated in the substrate and in contact with the conducting plate.

11 Claims, 5 Drawing Sheets

HEAT DISSIPATION DEVICE

BACKGROUND

1. Technical Field

The present disclosure relates generally to a heat dissipation device and, more particularly, to a heat dissipation device incorporating heat pipes therein.

2. Description of Related Art

With advancement of computer technology, electronic devices operate at a high speed. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Typically, the heat dissipation device comprises a base formed from aluminum and contacting with the electronic device, a plurality of fins parallel to the base and three U-shaped heat pipes thermally connecting the base and the fins together. The heat pipes each comprise an evaporator embedded in a top surface of the base and two condensers extending through the fins. Heat absorbed from the electronic device by the base is transferred to the fins via the heat pipes, and then dissipated to ambient air to positively cool down the heat electronic device. However, the heat dissipating efficiency of the heat dissipation device is determined mostly by heat conductivity of the based; as a result, the base made of a material having comparatively low conductivity such as aluminum unduly affects a performance of the dissipating efficiency of the heat dissipation device. Obviously, to improve the heat dissipating efficiency, the base can be made of a material having comparatively high conductivity such as copper; but to replace the whole base with a copper one would increase the cost and the weight of the heat dissipation device significantly.

What is needed, therefore, is a heat dissipation device having an outstanding capability of heat dissipation whilst cost and weight thereof do not increase too much.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
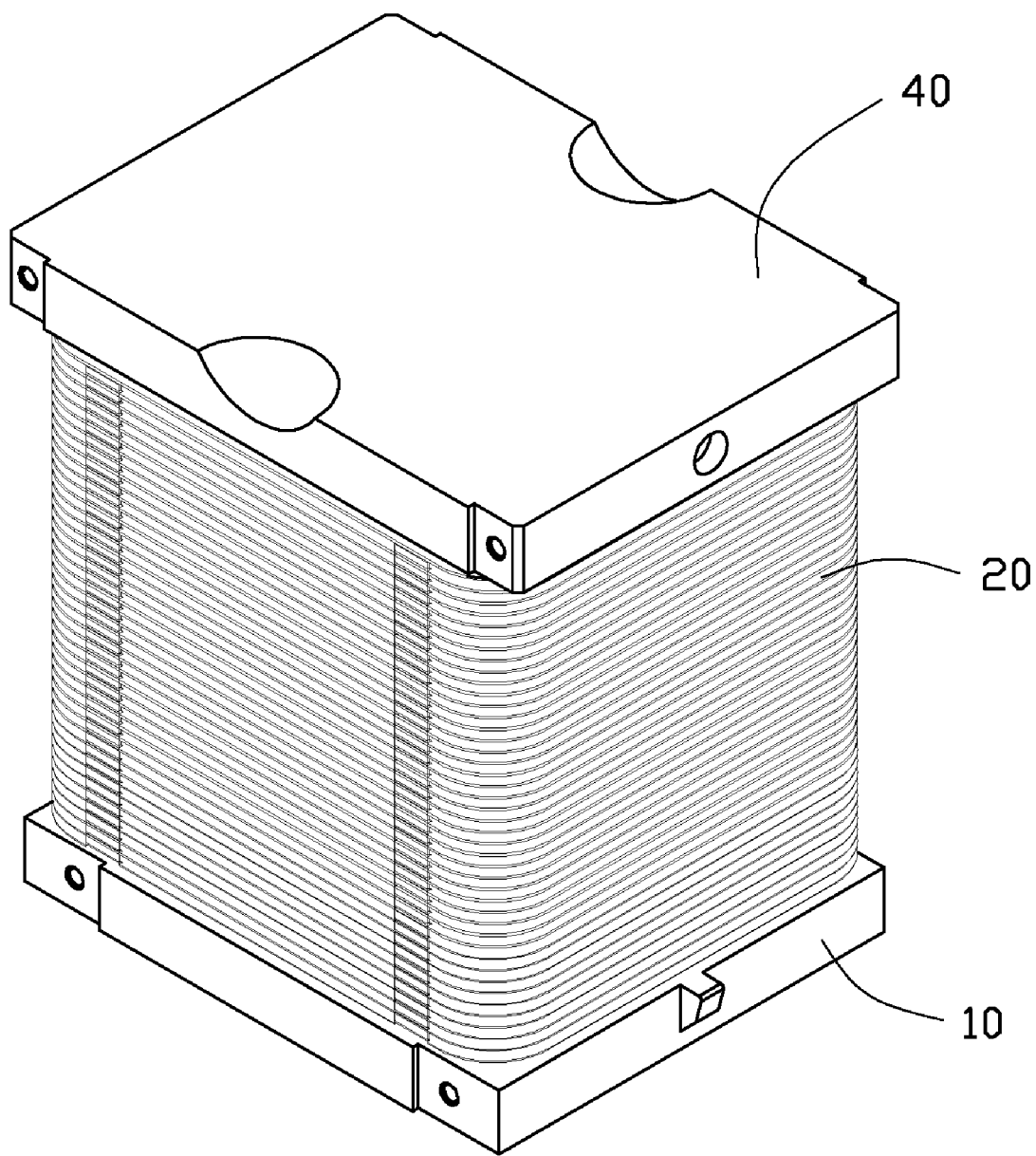
FIG. 1 is an isometric, assembled view of a heat dissipation device in accordance with an embodiment of the present disclosure.
Figure 2:
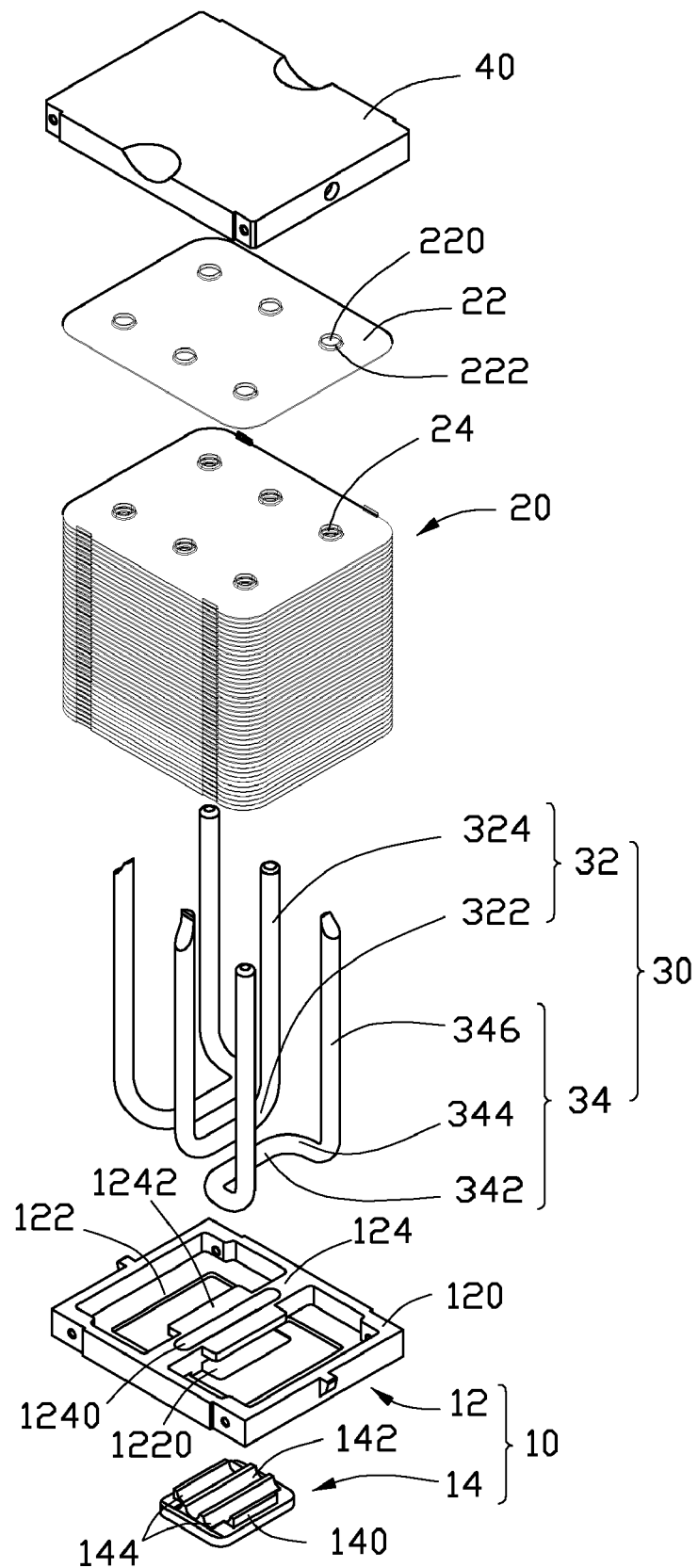
FIG. 2 is an exploded view of the heat dissipation device of FIG. 1.
Figure 3:
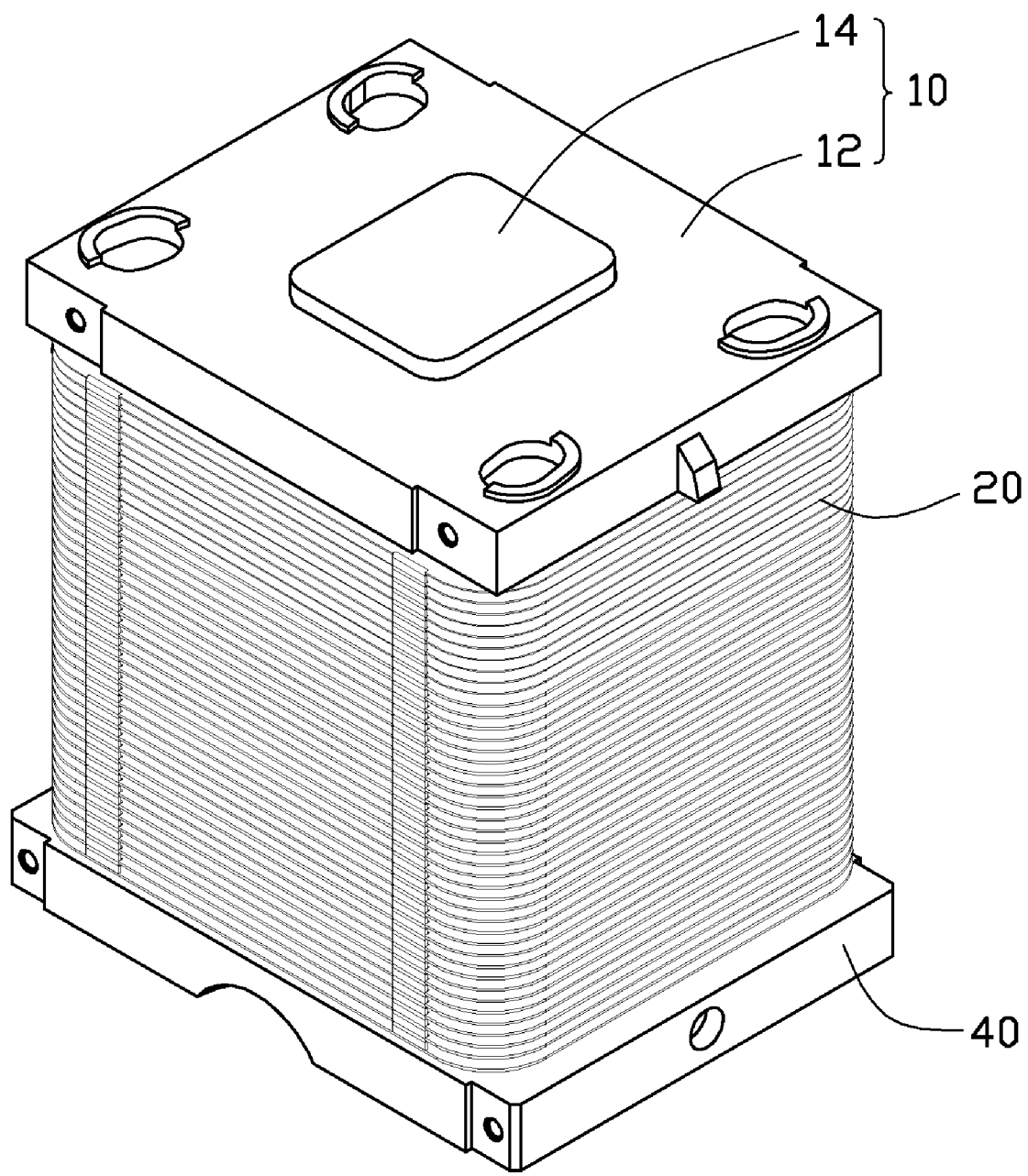
FIG. 3 is an inverted, assembled view of the heat dissipation device of FIG. 1.
Figure 4:
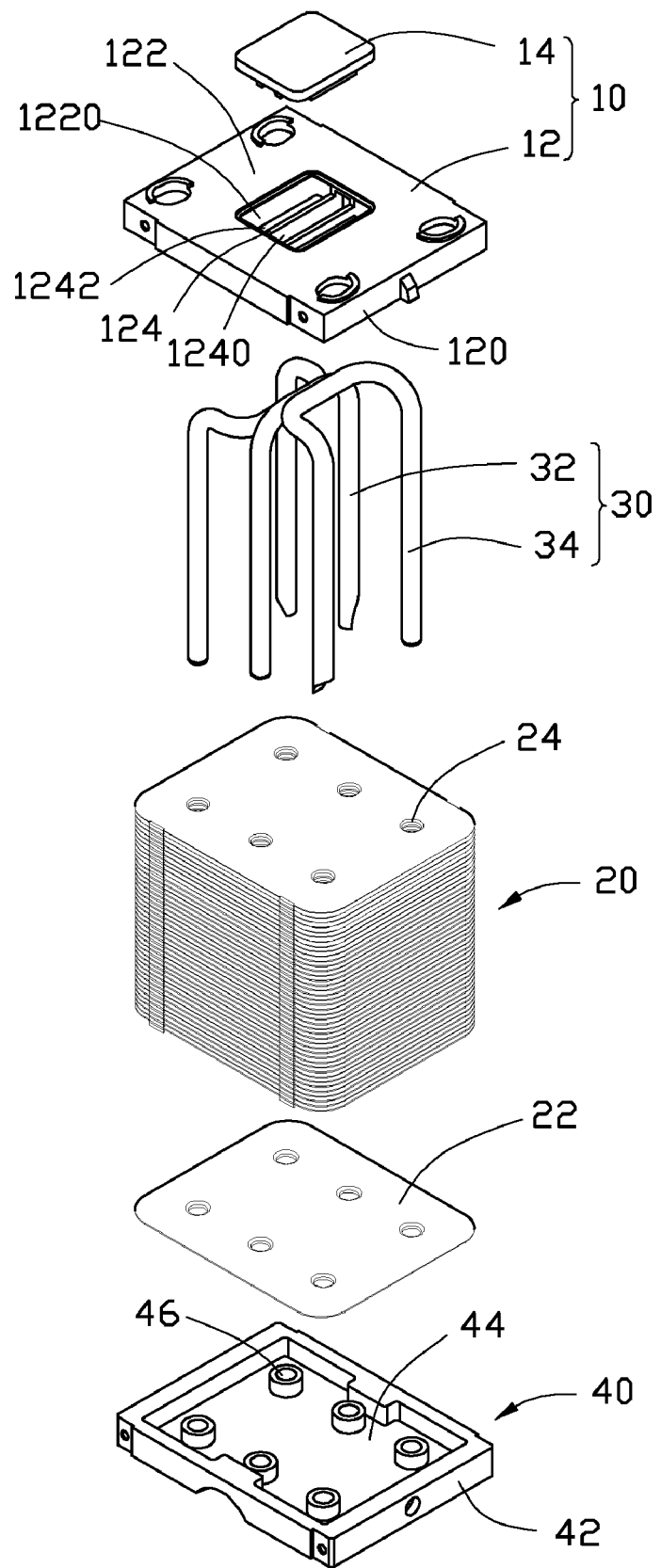
FIG. 4 is an exploded view of the heat dissipation device of FIG. 3.

Referring to FIGS. 1-4, a heat dissipation device in accordance with an embodiment of the present disclosure is utilized to dissipate heat originated by a heat-generating component (not shown). The heat dissipation device comprises a base 10, a fin group 20 placed on a top of the base 10, a heat pipe group 30 thermally connecting the base 10 and the fin group 20 together and a top cover 40 covering a top of the fin group 20 and ends of the heat pipe groups 30.

The base 10 comprises a substrate 12 and a conducting plate 14 engaging with a bottom of the substrate 12. The substrate 12 is made of light metal such as aluminum and comprises a rectangular frame 120, a supporting plate 122 extending inwardly from a bottom of the frame 120 and a beam 124 spanning over the supporting plate 122 and connecting two opposite inner portions of the frame 120. The supporting plate 122 has a bottom surface coplanar with a bottom surface of the frame 120 and defines a rectangular opening 1220 in a central part thereof. The beam 124 is located over a middle portion of the opening 1220 and parallel to two opposite short sides of the frame 120. An elongated slot 1240 is defined in a middle of the beam 124 along a lengthways direction of the beam 124. Two pressing plates 1242 extend outwardly and horizontally from two opposite lateral sides of an upper portion of the beam 124. The two pressing plates 1242 are parallel and separated from the supporting plate 122 and located over two lateral parts of the opening 1220 at two lateral sides of the beam 124. The pressing plates 1242 have top surfaces coplanar with a top surface of the frame 120 and the beam 124.

The conducting plate 14 has a rectangular configuration and is made of heavy metal such as copper with a higher heat conductivity. The conducting plate 14 has a size slightly larger than that of the opening 1220 in the supporting plate 122 of the substrate 12. A protruding part 140 protrudes from a central part of a top surface of the conducting plate 14 and occupies a most part of the top surface of the conducting plate 14. An elongated first receiving groove 142 is defined in a midline of a top of the protruding part 140 of the conducting plate 14 and parallel to two opposite lateral sides of the conducting plate 14. Two elongated second receiving grooves 144 are defined in the top of the protruding part 140 of the conducting plate 14 and located side by side at two lateral sides of the first receiving groove 142.

The fin group 20 supported on the top surface of substrate 12 of the base 10 comprises a plurality of fins 22 horizontally sacked together. The fins 22 are spaced from each other with a constant distance and parallel to the top surface of the substrate 12. A plurality of vertically through holes 24 are defined in the fin group 20 and perpendicular to the fins 22. The through holes 24 are arranged in two rows parallel to two opposite front and rear sides of the fin group 20. Each row consists of three through holes 24 spaced from each other.

The heat pipe group 30 includes a first heat pipe 32 and two second heat pipes 34. The first heat pipe 32 is substantially U-shaped in profile, and comprises a linear evaporating section 322 and two vertical condensing sections 324 bent upwards from two opposite ends of the evaporating section 322. Each second heat pipe 34 comprises a U-shaped section and two vertical condensing sections 346 bent upwards from two ends of the U-shaped section. The U-shaped section is in a plane perpendicular to the condensing sections 346 and comprises an evaporating section 342 and two connecting sections 344 extending perpendicular and horizontally from two opposite ends of the evaporating section 342.

The top cover 40 comprises a rectangular top frame 42 and a rectangular top plate 44 formed on a top of the top frame 42. The top frame 42 has a size which is consistent with that of the frame 120 of the substrate 12 of the base 10 and slightly larger than that of the fins 22 of the fin group 20. A plurality of receiving cylinders 46 corresponding to the through holes 24 of the fin group 20 extend downwardly and perpendicularly from a bottom surface of the top plate 44 and are surrounded by the top frame 42.

Figure 5:
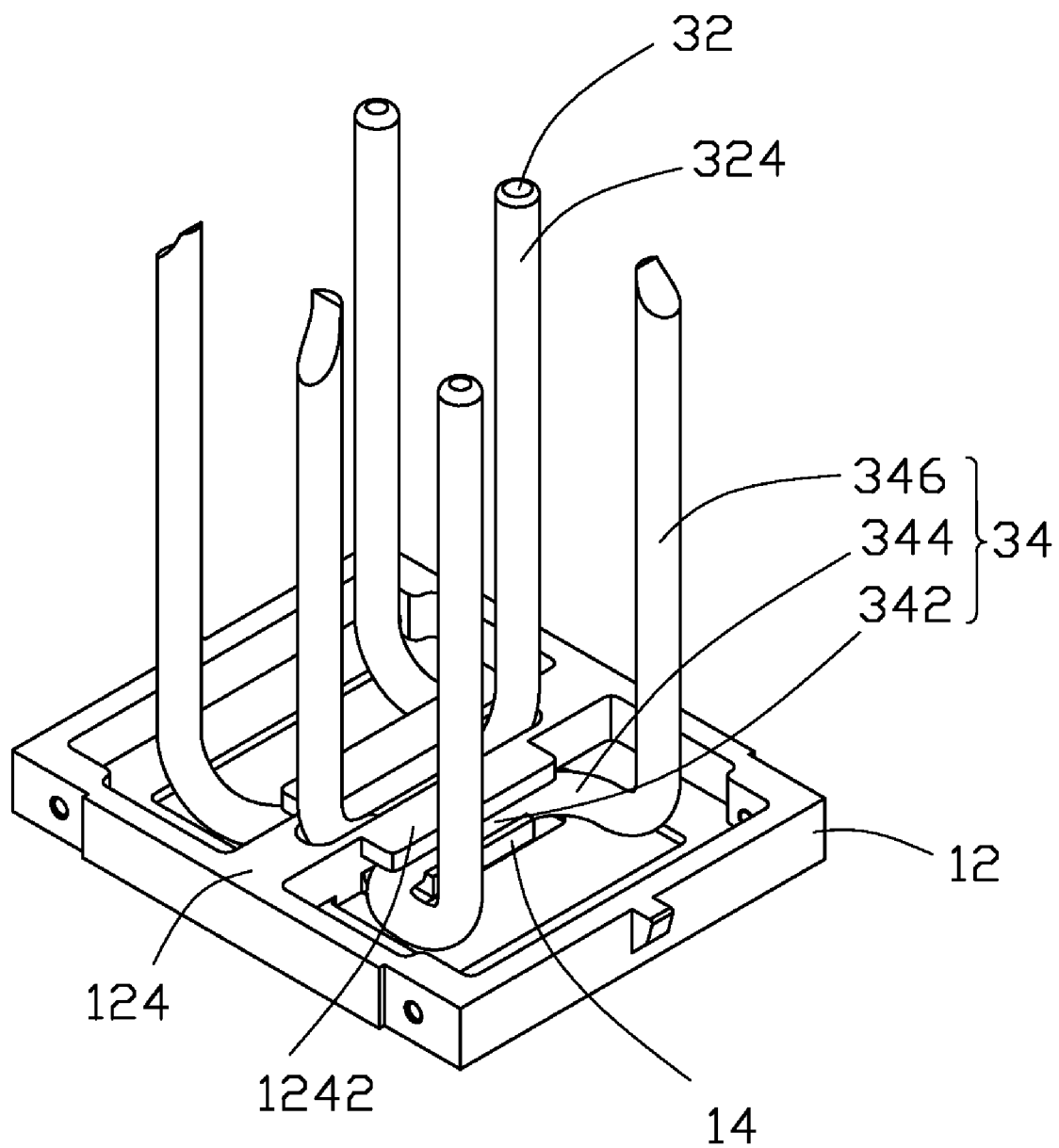
FIG. 5 is an assembled view of a heat pipe group with a base of the heat dissipation device of FIG. 2.

In assembly of the heat dissipation device, the protruding part 140 of the conducting plate 14 is snugly received in the opening 1220 of the substrates 12. The conducting plate 14, except the protruding part 14, is located beneath the substrate 12 with a peripheral portion thereof engaging the bottom surface of the supporting plate 122 of the substrate 12. Also referring to FIG. 5, the evaporating section 322 of the first heat pipe 32 is wholly received in the slot 1240 of the beam 124 of the substrate 12, while a lower portion of the evaporating section 322 is received in the first receiving groove 142 of the conducting plate 14. The evaporating sections 342 of the second heat pipes 34 are respectively received in the second receiving grooves 144 of the conducting plate 14 and sandwiched between the pressing plates 1242 of the beam 124 and the conducting plate 14, while the connecting sections 344 of the second heat pipes 34 are placed on the supporting plate 122 of the substrate 12. The evaporating section 322 of the first heat pipe 32 and the U-shaped sections of the second heat pipes 34 consisting of the evaporating sections 342 and the connecting section 344 are all surrounded by the frame 120 of the substrate 12 and received in a space defined in the frame 120.

The condensing sections 324 of the first heat pipe 32 and the condensing sections 346 of the second heat pipes 34 extend upwardly from the top of the substrate 12 and are respectively received in the through holes 24 of the fin group 20. Upper portions of the condensing sections 324, 346 are extended upwardly through the through holes 24 of the fin group 20 and located at the top of the fin group 20. The top cover 40 is placed on the top of the fin group 20 and receives the upper portions of the condensing sections 324, 346 in the receiving cylinders 46 thereof. The fin group 20 and the heat pipe group 30 are wholly sandwiched between the base 10 and the top cover 40 and have no sharp part exposed outside such as the upper ends of the heat pipes 32, 34. In addition, the corners of the fin group 20 are located within peripheries of the base 10 and the top cover 40. Thus, use and transportation of the heat dissipation device are more safe and easy.

In use, heat generated by the heat-generating component is directly absorbed by the conducting plate 14 and evenly distributed over the fin group 20 through the conducting plate 14 and the heat pipe group 30 to dissipate into ambient environment. Aluminum is not as good as copper in thermal conduction, but aluminum is much lighter and cheaper than copper. The base 10 applies aluminum in most part thereof to reduce a total cost and weight of the base 10, but applies copper in a key part for conducting heat from the heat-generating component to the heat pipe group 30 to thus ensure that the heat generated by the heat-generating component can be timely removed away and would not be accumulated in some part of the base 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A heat dissipation device comprising:
  a base comprising a substrate and a conducting plate attached to a bottom of the substrate;
  a fin group placed on the base; and
  a plurality of heat pipes having evaporating sections and condensing sections extending upwardly from the evaporating sections;
  wherein the evaporating sections are wholly accommodated in the substrate and in contact with the conducting plate, and the condensing sections are extended upwardly through the fin group,
  wherein the substrate is made of aluminum and comprises a frame and a supporting plate formed on a bottom of the frame, while the conducting plate is made of copper and engages a bottom of the supporting plate;
  wherein the evaporating sections of the heat pipes are supported on the supporting plate and surrounded by the frame;
  wherein the conducting plate have a protruding part extending upwardly from a top thereof and extending through the supporting plate to contact the evaporating sections of the heat pipes;
  wherein an opening is defined in the supporting plate and receives the protruding part of the conducting plate therein;
  wherein the substrate has a beam spanning over the supporting plate and connected to two opposite inner portions of the frame;
  wherein the beam defines a slot therein and has two pressing plates extending outwardly and horizontally from two opposite lateral sides of an upper portion thereof

2. The heat dissipation device as claimed in claim 1, wherein a plurality of receiving grooves are defined in a top of the protruding part of the conducting plate and respectively receive the evaporating sections of the heat pipes therein.

3. The heat dissipation device as claimed in claim 1, wherein the heat pipes comprises a first heat pipe and two second heat pipes located at two sides of the first heat pipe, the first heat pipe comprising an evaporating section wholly received in the slot of the beam and two condensing sections extending upwardly from two opposite ends of the evaporation section into the fin group.

4. The heat dissipation device as claimed in claim 3, wherein each second heat pipe comprises an evaporating section sandwiched between one of the pressing plates and the conducting plate, two condensing sections extending upwardly through the fin group and two connecting sections extending horizontally from two opposite ends of the evaporating section to connect lower ends of the two condensing sections, the connecting sections being supported on the supporting plate and surrounded by frame.

5. A heat dissipation device comprising;
  a base comprising a substrate and a conducting plate attached to a bottom of the substrate;
  a fin group placed on the base; and
  a plurality of heat pipes having evaporating sections and condensing sections extending upwardly from the evaporating sections;
  wherein the evaporating sections are wholly accommodated in the substrate and in contact with the conducting plate, and the condensing sections are extended upwardly through the fin group; and
  a top cover comprising a top frame placed on a top of the fin group, a top plate formed on a top of the top frame and located over the fin group and a plurality of receiving cylinders extending downwardly from a bottom of the top plate and respectively receiving upper ends of the condensing sections of the heat pipes.

6. The heat dissipation device as claimed in claim 5, wherein the fin group and the heat pipes are all wholly sandwiched between the top cover and the base.

7. A heat dissipation device comprising:
a base comprising a substrate and a conducting plate attached to a bottom of the substrate, the substrate comprising a frame, and a supporting plate formed on a bottom of the frame, the conducting plate engaging a bottom of the supporting plate and having a protruding part extending upwardly from a top thereof through the supporting plate into a space surrounded by the frame;
a fin group placed on the base; and
a plurality of heat pipes having evaporating sections and condensing sections extending upwardly from the evaporating sections and through the fin group;
wherein the evaporating sections are wholly accommodated in the substrate and contact the protruding part of the conducting plate,. wherein the substrate has a beam spanning over the supporting plate and connected to two opposite inner portions of the frame;
wherein the beam defines a slot therein and has two pressing plates extending outwardly and horizontally from two opposite lateral sides of an upper portion thereof.

8. The heat dissipation device as claimed in claim 7, wherein an opening is defined in the supporting plate and receives the protruding part of the conducting plate therein.

9. The heat dissipation device as claimed in claim 8, wherein a plurality of receiving grooves are defined in a top of the protruding part of the conducting plate and respectively receive the evaporating sections of the heat pipes therein.

10. The heat dissipation device as claimed in claim 7, wherein the heat pipes comprises a first heat pipe and two second heat pipes located at two sides of the first heat pipe, the first heat pipe comprising an evaporating section wholly received in the slot of the beam and two condensing sections extending upwardly from two opposite ends of the evaporation section into the fin group.

11. The heat dissipation device as claimed in claim 10, wherein each second heat pipe comprises an evaporating section sandwiched between one pressing plate and the conducting plate, two condensing sections extending upwardly through the fin group and two connecting sections extending horizontally from two opposite ends of the evaporating section to connect lower ends of the two condensing sections, the connecting sections being supported on the supporting plate and surrounded by frame.

* * * * *